(12) United States Patent
Kitsunezuka (10) Patent No.: US 9,362,889 B2
(45) Date of Patent: Jun. 7, 2016

(54) BANDPASS FILTER

(71) Applicant: Masaki Kitsunezuka, Tokyo (JP)

(72) Inventor: Masaki Kitsunezuka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 5 days.

(21) Appl. No.: 14/372,065

(22) PCT Filed: Jan. 15, 2013

(86) PCT No.: PCT/JP2013/000122
§ 371 (c)(1),
(2) Date: Jul. 14, 2014

(87) PCT Pub. No.: WO2013/108611
PCT Pub. Date: Jul. 25, 2013

(65) Prior Publication Data
US 2015/0236667 A1    Aug. 20, 2015

(30) Foreign Application Priority Data
Jan. 18, 2012 (JP) .................................. 2012-007875

(51) Int. Cl.
*H03K 5/00* (2006.01)
*H03H 11/12* (2006.01)

(52) U.S. Cl.
CPC ..................... *H03H 11/12* (2013.01)

(58) Field of Classification Search
CPC ....................................................... H03H 11/12
USPC .......................... 327/308, 551–559, 355–359
See application file for complete search history.

(56) References Cited

U.S. PATENT DOCUMENTS

| 4,787,650 | A | * | 11/1988 | Doi | ..................... | B60G 17/018 |
| | | | | | | 280/124.158 |
| 5,543,756 | A | | 8/1996 | Anderson | | |
| 5,917,187 | A | * | 6/1999 | Takada | ................. | H03K 17/941 |
| | | | | | | 250/338.2 |
| 7,088,985 | B2 | * | 8/2006 | Ismail | .................... | H03H 11/04 |
| | | | | | | 455/296 |
| 2010/0267354 | A1 | | 10/2010 | Mirzaei et al. | | |
| 2011/0003569 | A1 | | 1/2011 | Mirzaei et al. | | |

FOREIGN PATENT DOCUMENTS

JP          08-316785 A       11/1996

OTHER PUBLICATIONS

International Search Report for PCT/JP2013/000122 dated Apr. 23, 2013.

* cited by examiner

*Primary Examiner* — Dinh T Le
(74) *Attorney, Agent, or Firm* — Sughrue Mion, PLLC

(57) ABSTRACT

A bandpass filter is provided that prevents clock leakage to the input side of an amplifier circuit and has excellent out-of-passband signal attenuation. It includes an amplifier (102) connected between an input terminal and an output terminal, an impedance frequency conversion circuit (101) that is connected between an output of the amplifier and ground and changes impedance depending on whether or not the frequency of a signal output from the amplifier is within a predetermine passband, and a feedback circuit (103) connected between the output and an input of the amplifier.

11 Claims, 8 Drawing Sheets

FIRST EXEMPLARY EMBODIMENT

FIG. 2C

AMPLIFIER 102

FIG. 2D

FEEDBACK CIRCUIT 103

FIG. 2A

IMPEDANCE FREQUENCY CONVERTER 101

FIG. 2B

CLOCK SIGNALS (FREQUENCY f)

FIG. 7
FOURTH EXEMPLARY EMBODIMENT

FIG. 8B
DOUBLE BALANCED MIXER 1101

FIG. 8A
IMPEDANCE FREQUENCY CONVERTER 401

FIG. 8C
AMPLIFIER 402

BANDPASS FILTER

CROSS REFERENCE TO RELATED APPLICATIONS

This application is a National Stage of International Application No. PCT/JP2013/000122 filed Jan. 15, 2013, claiming priority based on Japanese Patent Application No. 2012-007875, filed Jan. 18, 2012, the contents of all of which are incorporated herein by reference in their entirety.

TECHNICAL FIELD

The present invention relates to a bandpass filter using an impedance frequency converter.

BACKGROUND ART

When a radio signal is received, a bandpass filter for suppressing signals outside a desired band is required to prevent a reception circuit from being saturated with interfering signals, and a variety of such filters have been proposed. For example, PTL 1 discloses a circuit (impedance frequency conversion circuit) having a configuration in which a radio frequency (RF) signal and a clock signal (local oscillator frequency signal) are inputted by a passive mixer, whose output is grounded via a capacitive impedance. With such a circuit configuration, it is possible to realize a narrow pass bandwidth at a high-frequency band by utilizing the fact that frequency conversion is made as much as the frequency of the clock signal at the passive mixer. If such an impedance frequency conversion circuit including a passive mixer and a capacitive impedance is placed prior to a common-source amplifier circuit, a bandpass filter can be constructed matching the impedance at a preceding stage such as an antenna as shown in, for example, FIG. 10 of PTL 1, making it possible to prevent the power of out-of-band unnecessary interfering signals from being input to the amplifier circuit.

CITATION LIST

Patent Literature

[PTL 1]
U.S. Patent Application Publication No. 2010/0267354 Specification

SUMMARY OF INVENTION

Technical Problem

However, the bandpass filter disclosed in PTL 1 as described above has the following problems.

First, the bandpass filter with the impedance frequency conversion circuit placed at a prior stage to the amplifier circuit has the problem that the clock signal for frequency conversion will leak to the input side. If an antenna is present at a prior stage to the amplifier circuit, the leakage of the clock signal is emitted as radio waves. Moreover, if multiple stages are connected to increase the amount of out-of-band attenuation, the flatness within a passband will be impaired. Further, in case that a wide signal band is desired, it is necessary to set the filter passband wide, which makes it difficult to greatly attenuate interfering signals out of the passband.

Accordingly, an object of the present invention is to provide a bandpass filter that prevents clock leakage to the input side of an amplifier circuit and has excellent out-of-passband signal attenuation.

Solution to Problem

According to the present invention, a bandpass filter having an input terminal and an output terminal is characterized by comprising: an amplifier connected between the input terminal and the output terminal; an impedance frequency conversion circuit that is connected between an output of the amplifier and ground and changes impedance depending on whether or not a frequency of a signal output from the amplifier is within a predetermined passband; and a feedback circuit connected between the output and an input of the amplifier.

Advantageous Effects of Invention

According to the present invention, it is possible to achieve a bandpass filter that prevents clock leakage to the input side of an amplifier circuit and has excellent out-of-passband signal attenuation.

DESCRIPTION OF EMBODIMENTS

Hereinafter, exemplary embodiments of the present invention will be described in detail with reference to drawings. Note that the same reference signs will be given to identical components throughout the drawings described below.

1. First Exemplary Embodiment

Figure 1:
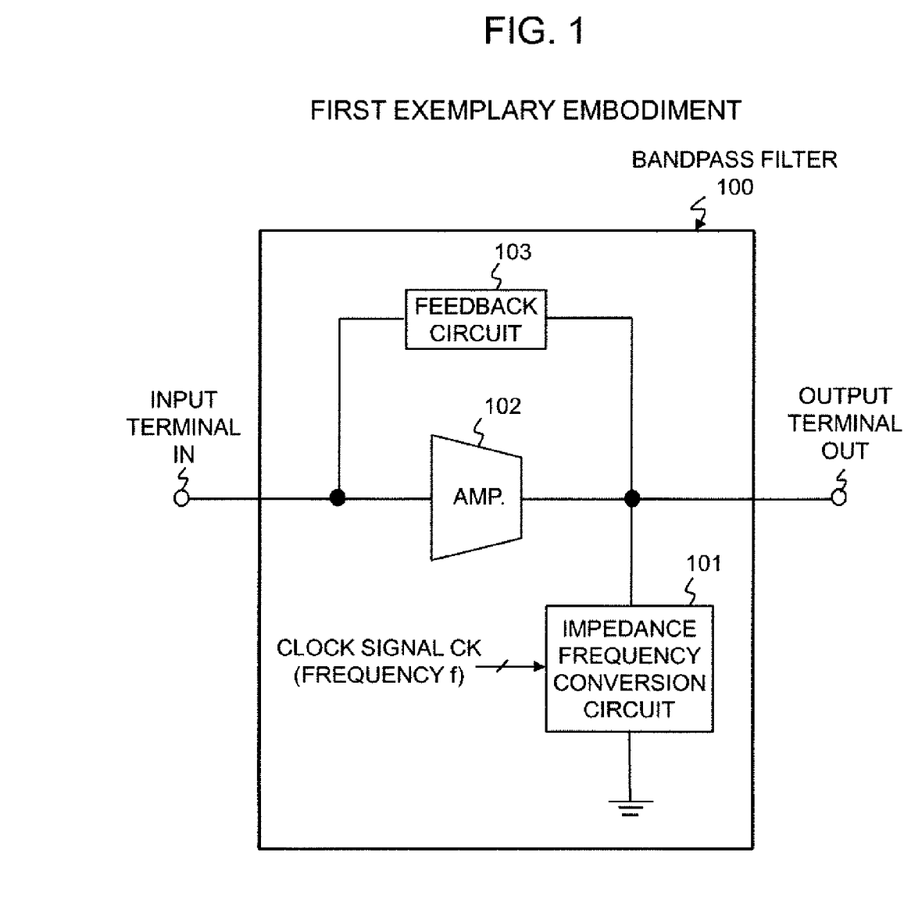
FIG. 1 is a block diagram showing a configuration of a bandpass filter according to a first exemplary embodiment of the present invention.

Referring to FIG. 1, a bandpass filter 100 according to a first exemplary embodiment of the present invention includes an impedance frequency conversion circuit 101, an amplifier 102, and a feedback circuit 103. More specifically, an input and an output of the amplifier 102 are connected to an input terminal IN and an output terminal OUT of the bandpass filter 100, respectively. Further, the output of the amplifier 102 is grounded via the impedance frequency conversion circuit 101, and the input and the output of the amplifier 102 are connected by the feedback circuit 103.

The impedance frequency conversion circuit 101 acts as a load that becomes high impedance in the vicinity of the frequency, f, of a clock signal CK but becomes low impedance at other frequencies. Accordingly, the frequency characteristic of a system formed of the impedance frequency conversion circuit 101 and the amplifier 102 presents a bandpass filter characteristic that allows input signals within a predetermined frequency range with the frequency f of the clock signal CK at the center to pass through but does not allow input signals of other frequency components (interfering signals) to pass through.

Further, this bandpass filter characteristic reflects, via the feedback circuit 103, on the frequency characteristic of an input impedance of the amplifier 102. That is, for an input impedance of a system formed of the amplifier 102 and the feedback circuit 103, if element values are selected so as to yield a desired impedance (for example, 500) across a wide band, impedance matching can be made in the narrow band according to the bandpass filter characteristic made by the impedance frequency conversion circuit 101. That is, it is possible to prevent the power of interfering signals that are far apart from the clock frequency f from entering the amplifier 102. At the same time, since the feedback circuit 103 is inserted between the impedance frequency conversion circuit 101 and the input terminal of the amplifier 102, it is possible to greatly reduce the amount of leakage of a clock signal generated at the impedance frequency conversion circuit 101 to the input side of the amplifier 102.

Hereinafter, a specific example of the configuration of the bandpass filter 100 shown in FIG. 1 will be described with reference to FIG. 2.

Figure 2A:
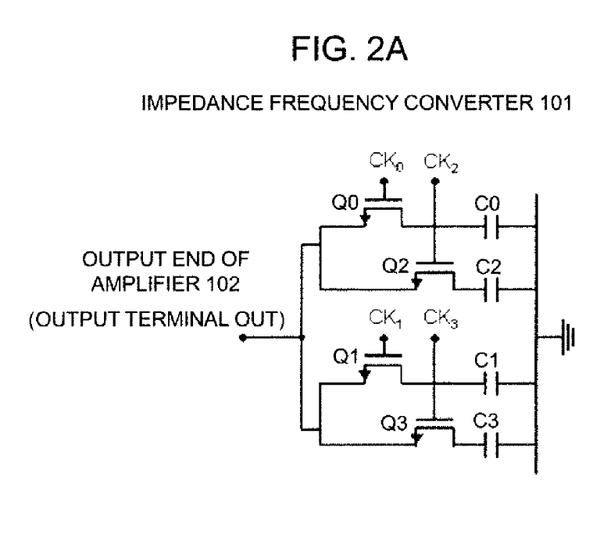
FIG. 2A is a circuit diagram showing an example of a configuration of an impedance frequency converter.
Figure 2B:
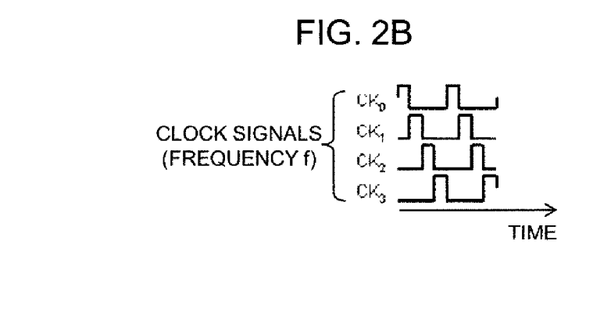
FIG. 2B is a time chart of a clock signal.

The impedance frequency conversion circuit 101 includes NMOS (N-channel Metal-Oxide-Semiconductor) transistors Q0 to Q3, to the gates of which clock signals $CK_0$ to $CK_3$ are applied, respectively, and capacitors C0 to C3 which are connected in series to the respective NMOS transistors. The NMOS transistor side of the impedance frequency conversion circuit 101 is connected to the output terminal OUT while the capacitor side thereof is grounded, as shown in FIG. 2A. The NMOS transistors Q0 to Q3 act as switches that fall in closed state when gate voltage is at a high level, and act as a single balanced mixer as a whole by the clock signals $CK_0$ to $CK_3$ shown in FIG. 2B being applied thereto. The capacitors may have variable capacitances using capacitance arrays that can be switched by using varactors or switches, allowing the passband width to be changed in accordance with the value of capacitance. The clock signals $CK_0$ to $CK_3$ are 4-phase signals of the same frequency f that are out of phase with each other by 90 degrees, and do not simultaneously become a high level as shown in FIG. 2B.

Figure 2C:
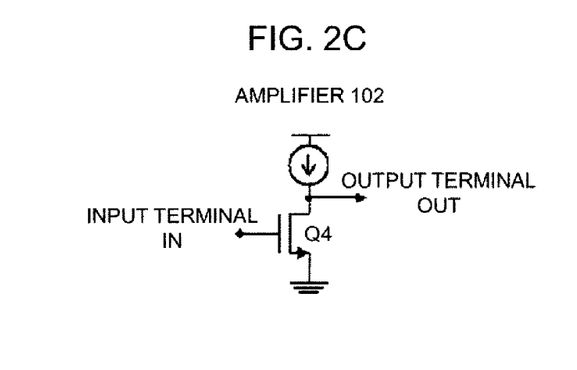
FIG. 2C is a circuit diagram showing an example of a configuration of an amplifier.

The amplifier 102 includes a NMOS transistor Q4 with its source terminal grounded and a current source load as shown in FIG. 2C, and has a voltage-to-current conversion function that outputs a current corresponding to a voltage input to its gate terminal. Moreover, the amplifier 102 may be a variable amplifier that can change the voltage-to-current conversion gain. This voltage-to-current conversion gain is determined depending on the passband width and the passband gain.

Figure 2D:
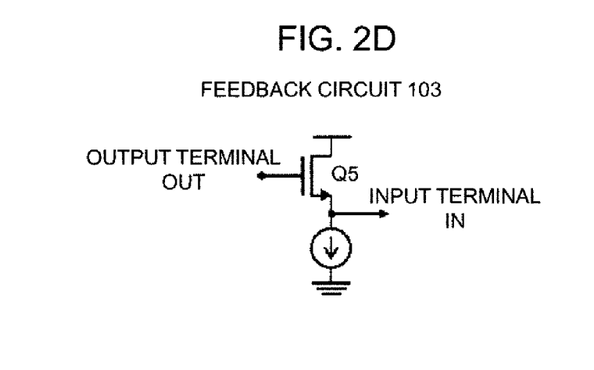
FIG. 2D is a circuit diagram showing an example of a configuration of a feedback circuit.

The feedback circuit 103 can be configured using a passive element such as a resistor, a capacitor and/or an inductor. However, it may be an active circuit including a transistor Q5 such as a source follower as shown in FIG. 2D.

2. Second Exemplary Embodiment

A bandpass filter 100b according to a second exemplary embodiment of the present invention can change the center frequency and the frequency to be impedance-matched by changing the clock frequency.

Figure 3:
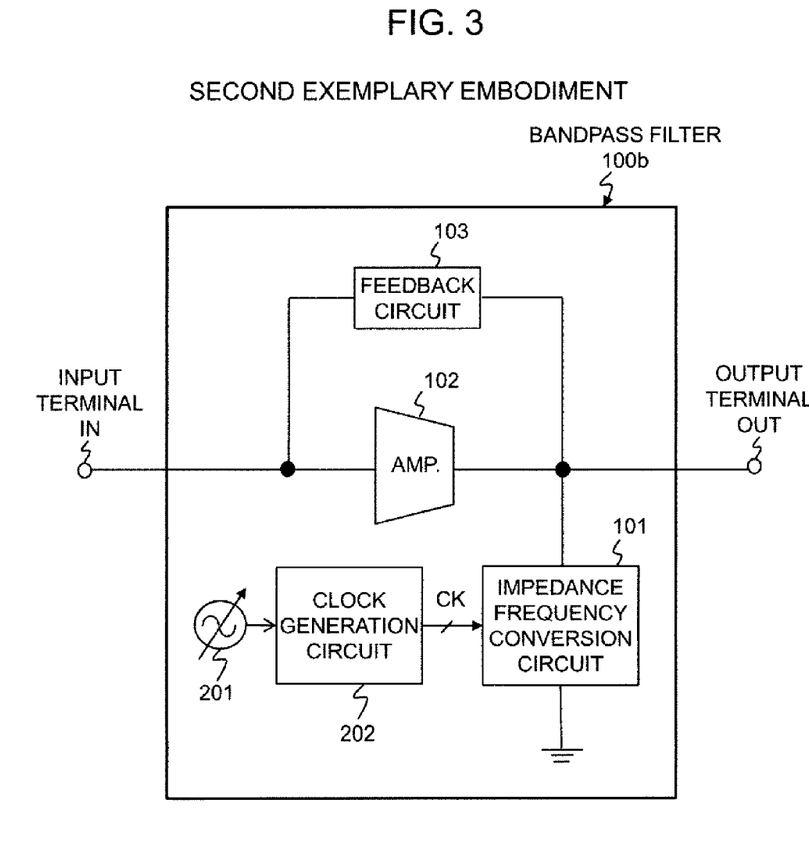
FIG. 3 is a block diagram showing a configuration of a bandpass filter according to a second exemplary embodiment of the present invention.

Referring to FIG. 3, a difference from the above-described first exemplary embodiment (FIG. 1) is that a variable frequency oscillator circuit 201 and a clock generation circuit 202 are provided. Accordingly, those blocks having the same functions as in the first exemplary embodiment shown in FIG. 1 are given the same reference signs and a description thereof will be omitted.

Figure 4:
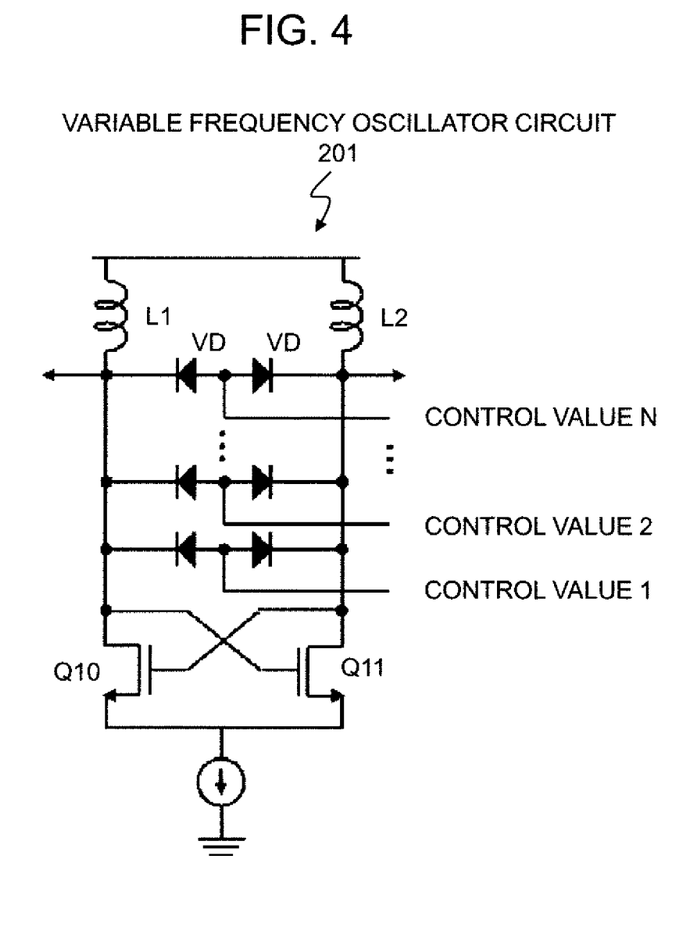
FIG. 4 is a circuit diagram showing an example of a configuration of a variable frequency oscillator circuit.

As shown in FIG. 4, the variable frequency oscillator circuit 201 includes inductors L1 and L2, N pairs of varactors VD, cross-coupled NMOS transistors Q10 and Q11, and a current source, and changes the oscillation frequency by controlling the value of control voltage of each pair of the varactors. Note that it is preferable to configure a phase-locked loop (PLL) circuit to obtain a signal of a desired oscillation frequency.

Figure 5:
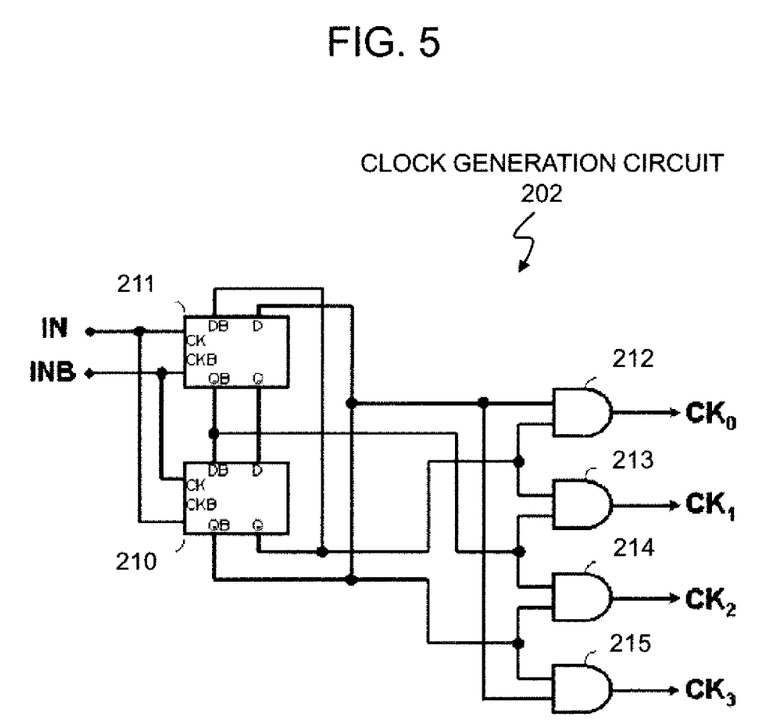
FIG. 5 is a circuit diagram showing an example of a configuration of a clock generation circuit.

As shown in FIG. 5, the clock generation circuit 202 includes delay flip-flops (DFFs) 210 and 211 and AND gates 212 to 215. The DFFs 210 and 211 divide differential signals IN and INB of a frequency 2f by 2, and four-phase signals output from the DFFs 210 and 211 are ANDed with each other by the AND gates 212 to 215, whereby four-phase clock signals $CK_0$ to $CK_3$ with a duty ratio of 25% as shown in FIG. 2B are output, respectively.

Note that although the four-phase signals are generated by employing here the variable frequency oscillator 201, which uses inductors and capacitance, and the DFFs 210 and 211, which are frequency dividers, it is also possible to employ a ring-type oscillator utilizing inverter delays and the like. Specifically, four-phase signals can be obtained by using a ring-type oscillator with four stages of single-end inverters or two stages of differential inverters, without using frequency dividers.

3. Third Exemplary Embodiment

A bandpass filter 100c according to a third exemplary embodiment of the present invention has a configuration in which the circuits shown in FIG. 1 are cascaded in two stages.

Figure 6:
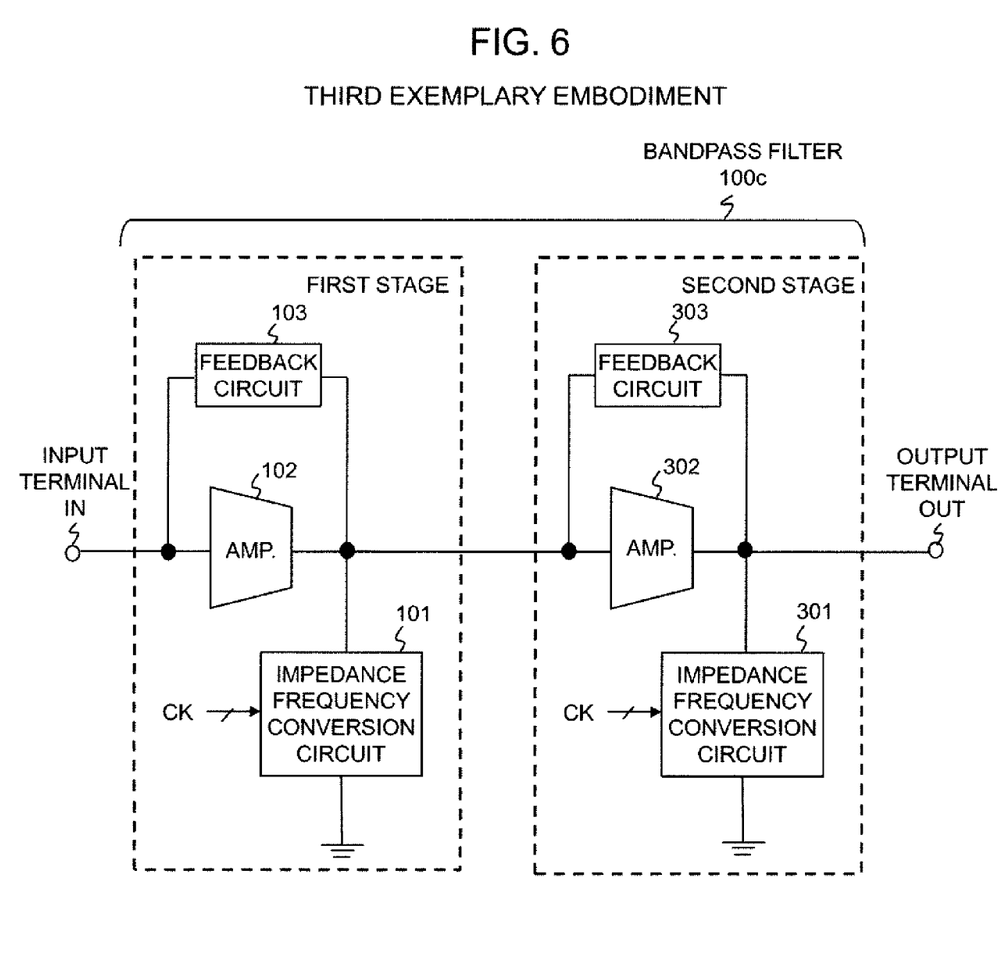
FIG. 6 is a block diagram showing a configuration of a bandpass filter according to a third exemplary embodiment of the present invention.

Referring to FIG. 6, a first stage of the bandpass filter 100c according to the present exemplary embodiment is the circuit shown in FIG. 1, and a second stage thereof, which has basically the same circuit configuration as the first stage, receives an output of the first stage as input and operates similarly. That is, the second stage includes an impedance frequency conversion circuit 301, an amplifier 302, and a feedback circuit 303 and is similarly wired. Thus cascading bandpass filters in two stages makes it possible to improve the amount of out-of-passband attenuation. In addition, it is possible to enhance the flatness within the passband, depending on the element values of the amplifiers 102 and 302 and the feedback circuits 103 and 303.

As a specific example, a description will be given assuming that the impedance frequency conversion circuits 101 and 301 have identical circuitry, the amplifiers 102 and 302 have identical circuitry, and the feedback circuits 103 and 303 are resistance elements. It is possible to achieve a bandpass filter with the Butterworth characteristic of maximum flatness within the passband by selecting element values that satisfy the following equation:

$$(2R_1+R_2)/\sqrt{(R_1 R_2(1-Gm \cdot R_1))} = \sqrt{2}$$

where Gm is the voltage-to-current conversion gain of the amplifiers 102 and 302, and $R_1$ and $R_2$ are the resistance element values of the feedback circuits 103 and 303.

Note that the passband width can be varied by changing the capacitance values $C_0$ to $C_3$ of the impedance frequency conversion circuits 101 and 301. That is, connecting multiple stages makes it possible to improve the amount of out-of-passband attenuation while ensuring the flatness within the passband. Moreover, the gain within the passband is determined by $(1+Gm \cdot R_1)(1+Gm \cdot R_2)/(1-Gm \cdot R_1)$ and is variable depending on the voltage-to-current conversion gain and the resistance values.

Furthermore, although the conditions to achieve a bandpass filter with the Butterworth characteristic are described here, it is also possible to configure a bandpass filter with, for example, the Chebyshev characteristic, depending on the element values. Thereby, a bandpass filter can be achieved that has a large amount of out-of-band attenuation in comparison with the Butterworth characteristic, even though ripples are allowed within the bandpass instead.

Note that although the feedback circuits 103 and 303 are connected to both the amplifiers 102 and 302, respectively, in FIG. 6, a feedback circuit is not necessarily connected to every amplifier. For example, a single feedback circuit may be connected to the output terminal of the amplifier circuit 302 and to the input terminal of the amplifier circuit 102. In addition, the present exemplary embodiment illustrates cascade connection in two stages as an example, but it is not limitative. Cascade connection may be made in three or more stages to obtain steeper cutoff characteristics.

4. Fourth Exemplary Embodiment

Figure 7:
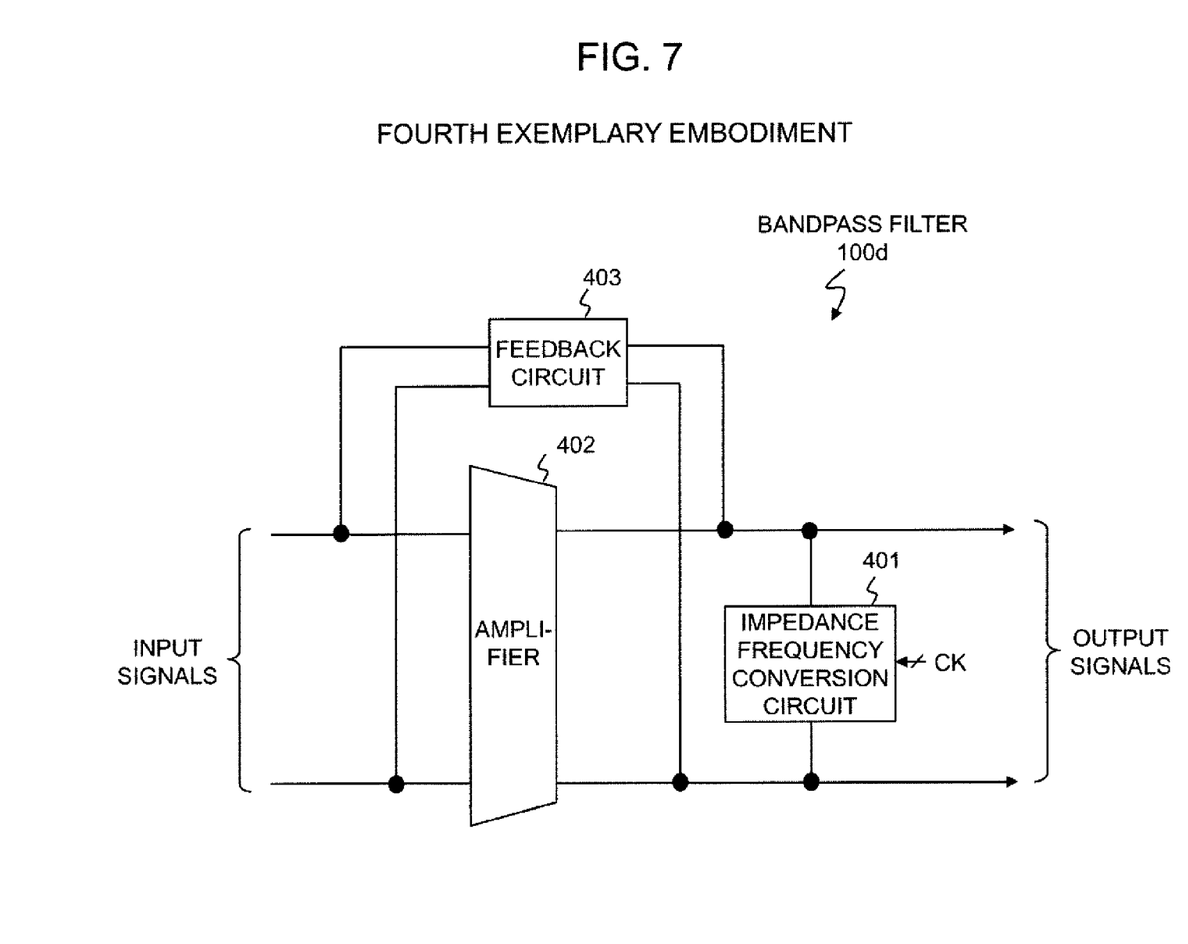
FIG. 7 is a block diagram showing a configuration of a bandpass filter according to a fourth exemplary embodiment of the present invention.

As shown in FIG. 7, a bandpass filter 100d according to a fourth exemplary embodiment of the present invention, compared with the first exemplary embodiment shown in FIG. 1, is different in that an impedance frequency conversion circuit 401, an amplifier circuit 402, and a feedback circuit 403 have a differential configuration. Forming the circuits in a differential configuration makes it possible to configure a filter with excellent tolerance against noise superimposed on power supply, common-mode noise, clock leakage, and the like. Moreover, a dynamic range can also be expanded because the signal amplitude that can be handled is doubled.

Figure 8A:
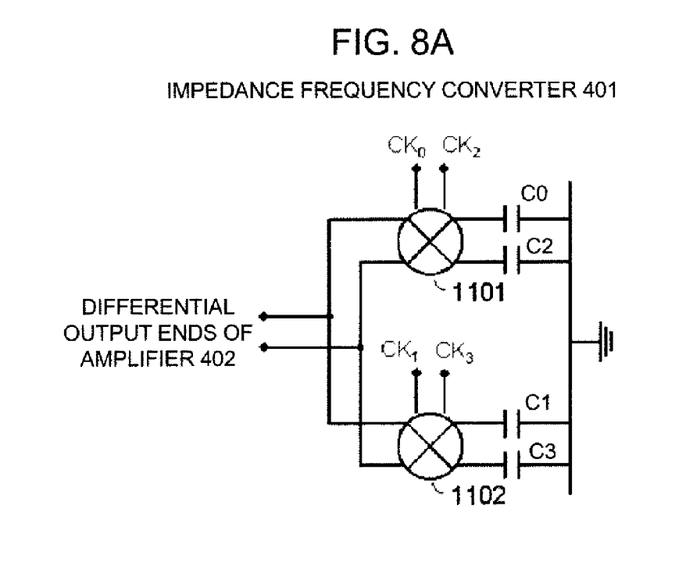
FIG. 8A is a circuit diagram showing an example of a configuration of an impedance frequency converter.
Figure 8B:
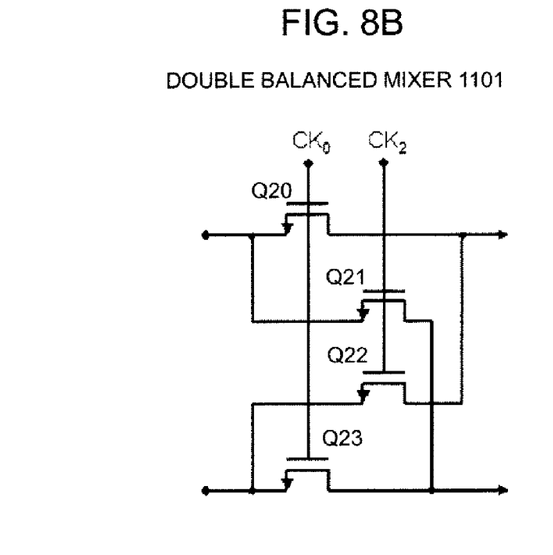
FIG. 8B is a circuit diagram showing an example of a configuration of a double balanced mixer.
Figure 8C:
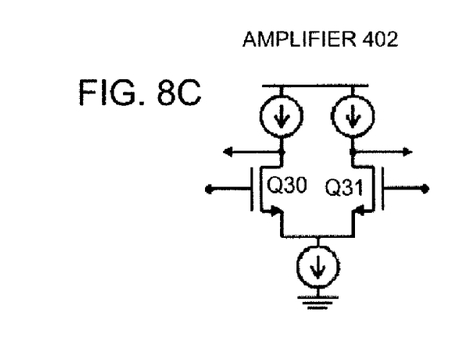
FIG. 8C is a circuit diagram showing an example of a configuration of an amplifier.

As shown in FIG. 8A, the impedance frequency conversion circuit 401 includes double balanced mixers 1101 and 1102 and capacitors C0 to C3. The double balanced mixer 1101 has a configuration including NMOS transistors Q20 to Q23 as shown in FIG. 8B, and the double balanced mixer 1102 also has a similar circuit configuration, only with clock signals being different. The amplifier 402 is a differential amplifier including NMOS transistors Q30 and Q31 as shown in FIG. 8C and is similar to the amplifier shown in FIG. 2C except that a tail current source is provided. Further, the feedback circuit 403, as in the first exemplary embodiment, may be a passive element such as a resistor, a capacitor and/or an inductor, or may be a circuit including an active element such as a source follower as shown in FIG. 2D.

5. Effects

As described above, according to the exemplary embodiments of the present invention, since an impedance frequency conversion circuit is not placed on the input side of an amplifier, it is possible to prevent the power of out-of-band interfering signals from entering the amplifier while avoiding clock leakage to the input side. This means that the present filter can perform input impedance matching in a narrow band. It also has the effect that the frequency to be matched and the filter center frequency can be changed according to the clock frequency f. Moreover, if multiple stages are connected, it is possible to improve the amount of out-of-passband attenuation while ensuring the flatness within the passband, by optimally designing variables including the amount of feedback.

INDUSTRIAL APPLICABILITY

The present invention is applicable to a bandpass filter at a radio reception stage in wireless communication equipment.

REFERENCE SIGNS LIST 100, 100b, 100c, 100d Bandpass filter
101, 301, 401 Impedance frequency conversion circuit
102, 302, 402 Amplifier
103, 303, 403 Feedback circuit
201 Variable frequency oscillator
202 Clock generation circuit.

The invention claimed is:

1. A bandpass filter having an input terminal and an output terminal, comprising:
   an amplifier connected between the input terminal and the output terminal;
   an impedance frequency conversion circuit that is connected between an output of the amplifier and ground of the bandpass filter and changes impedance depending on whether or not a frequency of a signal output from the amplifier is within a predetermined passband; and
   a feedback circuit connected between the output and an input of the amplifier,
   wherein the impedance frequency conversion circuit includes a passive mixer that receives an output of the amplifier as input and a capacitor connected between an output of the passive mixer and the ground, wherein a center frequency of the predetermined passband is set depending on a frequency of a clock signal input to the passive mixer.

2. The bandpass filter according to claim 1, wherein the amplifier is a voltage-to-current convertor that convers input voltage to current, wherein the impedance frequency conversion circuit becomes high impedance when an output frequency of the amplifier is within the predetermined passband but becomes low impedance when the output frequency is out of the predetermined passband.

3. The bandpass filter according to claim 1, wherein the capacitor is a variable capacitance capacitor, wherein a width of the predetermined passband is determined depending on a value of capacitance of the capacitor.

4. The filter according to claim 1, further comprising a variable frequency oscillator and a clock generator, wherein the frequency of the clock signal is changed depending on a frequency of the variable frequency oscillator.

5. A bandpass filter having an input terminal and an output terminal, wherein
   a plurality of filter circuits are cascaded between the input terminal and the output terminal, wherein
   each filter circuit comprises:
   an amplifier whose input is connected to the input terminal or an output of a preceding-stage filter circuit and whose output is connected to an input of a subsequent-stage filter circuit or the output terminal;

an impedance frequency conversion circuit that is connected between the output of the amplifier and ground and changes impedance depending on whether or not a frequency of a signal output from the amplifier is within a predetermined passband; and a feedback circuit connected between the output and the input of the amplifier, wherein the impedance frequency conversion circuit includes a passive mixer that receives an output of the amplifier as input and a capacitor connected between an output of the passive mixer and the ground, wherein a center frequency of the predetermined passband is set depending on a frequency of a clock signal input to the passive mixer.

6. The bandpass filter according to claim 5, wherein the amplifier is a voltage-to-current convertor that converts input voltage to current, wherein the impedance frequency conversion circuit becomes high impedance when an output frequency of the amplifier is within the predetermined passband but becomes low impedance when the output frequency is out of the predetermined passband.

7. The bandpass filter according to claim 5, wherein the capacitor is a variable capacitance capacitor, wherein a width of the predetermined passband is determined depending on a value of capacitance of the capacitor.

8. The bandpass filter according to claim 6, wherein the capacitor is a variable capacitance capacitor, wherein a width of the predetermined passband is determined depending on a value of capacitance of the capacitor.

9. A bandpass filter having an input terminal and an output terminal, wherein a plurality of filter circuits are cascaded between the input terminal and the output terminal, wherein each filter circuit comprises:

an amplifier whose input is connected to the input terminal or an output of a preceding-stage filter circuit and whose output is connected to an input of a subsequent-stage filter circuit or the output terminal; and an impedance frequency conversion circuit that is connected between the output of the amplifier and ground and changes impedance depending on whether or not a frequency of a signal output from the amplifier is within a predetermined passband, wherein a feedback circuit is connected between the output of the amplifier of a tail-end filter circuit and the input of the amplifier of a front filter circuit, wherein the impedance frequency conversion circuit includes a passive mixer that receives an output of the amplifier as input and a capacitor connected between an output of the passive mixer and the ground, wherein a center frequency of the predetermined passband is set depending on a frequency of a clock signal input to the passive mixer.

10. The bandpass filter according to claim 9, wherein the amplifier is a voltage-to-current convertor that converts input voltage to current, wherein the impedance frequency conversion circuit becomes high impedance when an output frequency of the amplifier is within the predetermined passband but becomes low impedance when the output frequency is out of the predetermined passband.

11. The bandpass filter according to claim 9, wherein the capacitor is a variable capacitance capacitor, wherein a width of the predetermined passband is determined depending on a value of capacitance of the capacitor.

* * * * *